(12) United States Patent
Takai

(10) Patent No.: US 6,246,272 B1
(45) Date of Patent: *Jun. 12, 2001

(54) POWER SUPPLY VOLTAGE DETECTING APPARATUS

(75) Inventor: Masami Takai, Tokyo (JP)

(73) Assignee: Ricoh Company, Ltd., Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 08/702,203

(22) Filed: Aug. 23, 1996

Related U.S. Application Data

(63) Continuation of application No. 08/186,421, filed on Jan. 25, 1994, now abandoned.

(30) Foreign Application Priority Data

Jan. 29, 1993 (JP) ...................................... 5-032427

(51) Int. Cl.$^7$ ................................................... H03K 17/22
(52) U.S. Cl. ............................................. 327/143; 327/81
(58) Field of Search .................................... 327/142, 143, 327/198, 50, 80, 81, 538, 540, 541, 542, 543; 365/227

(56) References Cited

U.S. PATENT DOCUMENTS

| | | | |
|---|---|---|---|
| 4,173,756 | * 11/1979 | Kawagai et al. | 327/50 |
| 4,293,782 | * 10/1981 | Tanaka et al. | 307/350 |
| 4,709,165 | * 11/1987 | Higuchi et al. | 307/350 |
| 4,873,458 | * 10/1989 | Yoshida | 307/362 |
| 5,109,163 | * 4/1992 | Benhamida | 307/272.3 |

FOREIGN PATENT DOCUMENTS

| | | | |
|---|---|---|---|
| 0093606 | 11/1983 | (EP) | G01R/19/165 |
| 1527462 | 10/1978 | (GB) | G01R/19/16 |
| 53-11068 | 2/1978 | (JP) . | |
| 53-73340 | 6/1978 | (JP) . | |
| 55-128162 | 10/1980 | (JP) . | |
| 61-34471 | 2/1986 | (JP) . | |
| 0207091 | * 9/1991 | (JP) | 365/227 |

OTHER PUBLICATIONS

Horowitz et al, "The Art of Electronics", Cambridge University Press, 1980, pp 224–225.*

Uyemura, "Fundamental of MOS Digital Integrated Circuits" Addison–Wesley Company, pp 35–36.*

Patent Abstracts of Japan, English–language abstract of Japan Patent Application No. 58–135466 laid open on Aug. 12, 1983, vol. 7, No. 249, (P–234) (1394), Nov. 5, 1983.

* cited by examiner

*Primary Examiner*—Toan Tran
(74) *Attorney, Agent, or Firm*—Cooper & Dunham LLP

(57) ABSTRACT

A power supply voltage detecting circuit includes: a depletion MOS transistor having its source and gate connected to the base thereof; and an enhancement MOS transistor which is serially connected to the depletion MOS transistor, which has its source connected to its base, and which is fed an output of the voltage divider through its gate. Therefore, the production yield can be greatly improved, and the production costs can be greatly reduced.

13 Claims, 3 Drawing Sheets

POWER SUPPLY VOLTAGE DETECTING APPARATUS

This is a continuation of application Ser. No. 08/186,421 filed Jan. 25, 1994 now abandoned.

BACKGROUND OF THE INVENTION

(1) Field of the Invention

The present invention relates to a power supply voltage detecting apparatus for detecting a drop in a power supply voltage below a specified level.

(2) Description of the Prior Art

Dry batteries are generally used as a power supply in a portable electric equipment unit such as a portable audio cassette tape player. When the energy of a dry battery is dissipated to an extent that the output voltage thereof drops to a certain level, there arises problems such as a degradation in a reproduced sound quality due to an unstable performance of a motor for running a tape. Hence, in this equipment unit means are provided for stopping a playback operation when a drop in the output voltage of a dry battery is detected.

FIG. 1 shows an essential part of such a portable electric equipment unit as mentioned above.

Referring to FIG. 1, a controlling part 1 controls the operation of this electric equipment unit; an operation display part 2 allows a user to operate this electric equipment unit; and a mechanism part 3 includes a motor and other driving parts of this electric equipment unit.

The power supply voltage output from a dry battery 4 is applied to the controlling part 1, the operation display part 2 and the mechanism part 3. A voltage detecting circuit 5 detects a drop in the output voltage of the dry battery 4 below a specified level, a detection signal DT being output therefrom to the controlling part.

Therefore, the controlling part 1 executes specified operations in accordance with an operational signal output from the operation display part 2 and stops an operation currently being performed when the detection signal DT output from the voltage detecting circuit 5 switches to a signal indicating that a low voltage has been detected.

FIG. 2 shows an example of the voltage detecting circuit 5.

Referring to FIG. 2, a reference voltage signal Vref output from a reference voltage generating circuit 7 is fed to the negative terminal of a difference amplifier 6; a fraction of a power supply voltage Vdd obtained by means of a voltage divider comprising resistors 8 and 9 is fed to the positive terminal of the difference amplifier 6.

Therefore, when the power supply voltage Vdd is at a sufficiently large level and the fraction of the power supply voltage obtained by means of the voltage divider comprising the resistors 8 and 9 is larger than the reference voltage Vref, the detection signal DT output from the difference amplifier 6 is at a logical level H.

When the energy of the dry battery 4 is dissipated and the level of the power supply voltage Vdd drops to such an extent that the fraction of the power supply voltage obtained by means of the voltage divider comprising the resistors 8 and 9 is smaller than the reference voltage Vref, the detection signal output from the difference amplifier 6 is at a low level L.

Electric equipment driven by dry batteries is configured such that a main circuit thereof is constructed of CMOS-type semiconductor devices so as to ensure a long life for the dry batteries. Therefore, the voltage detecting circuit 5 in such equipment is configured as shown in FIG. 3. In the figure, those parts that are identical to or correspond to the parts of FIG. 2 are designated by the same reference numerals as in FIG. 2.

Referring to FIG. 3, p-channel MOS transistors 11, 12 and n-channel MOS transistors 13, 14 form a CMOS-type difference amplifier. A constant-current source 15 is provided so as to ensure a stable operation of this difference amplifier.

The reference voltage Vref output from the reference voltage generating circuit 7 is applied to thea gate of the n-channel MOS transistor 13. The fraction of the power supply voltage obtained by means of the voltage divider comprising the resistors 8 and 9 is applied to the gate of the n-channel MOS transistor 14. A signal present at a junction between the p-channel MOS transistor 12 and the n-channel MOS transistor 14 is fed to the input of an output signal generating circuit 16, as an output signal of this difference amplifier circuit.

The output signal generating circuit 16 converts the output signal of the difference amplifier circuit to a logical signal having a specified logical level. The output signal from the output signal generating circuit 16 is then supplied to a circuit in the next stage, as the detection signal DT.

However, the conventional apparatus described above has the following disadvantages.

For example, there is now available, as a result of power dissipation being reduced, a portable audio cassette tape player operable with one size AA battery. In such an equipment unit operable with one size AA battery, the voltage detecting circuit 5 described above is required to be able to detect a voltage in the neighborhood of 0.9 volts.

Since, in the circuit shown in FIG. 3, it is necessary to operate the p-channel MOS transistors 11, 12 and n-channel MOS transistors 13, 14 in a saturation range, the power supply voltage Vdd with which this difference amplifier is operable, i.e. (Vdd–Vss), where Vss is a ground level, is in the range expressed by the following inequality (1).

$$(Vdd-Vss) \geq Vth11 + Vref - Vth13 + Vd7 \tag{1}$$

where Vth11 indicates a threshold voltage of the p-channel MOS transistor 11; Vth13 indicates a threshold voltage of the n-channel MOS transistor 13; and Vd7 is a voltage drop across the constant-current source 7.

Thus, the voltage range over which the difference amplifier shown in FIG. 3 is operable is affected by the above four factors, namely, the threshold voltage of the p-channel MOS transistor 11, the threshold voltage of the n-channel MOS transistor 13, the reference voltage and the voltage drop across the constant-current source 7.

Since, normally, variations in these factors are created during a process of fabricating integrated circuits constituting a difference amplifier, some of the fabricated integrated circuits may cause the voltage range, over which range the difference amplifier is operable, to be extended beyond 0.9 volts. That as many as four factors affect the voltage range increases the chances that a defective circuit will be produced, thus resulting in an unsatisfactory production yield and very expensive production costs.

SUMMARY OF THE INVENTION

The present invention has been developed in view of the above circumstances, and it is an object of the present invention to provide a power supply voltage detecting apparatus capable of operating in a stable manner with a power supply voltage as low as 0.9 volts and greatly reducing production costs.

The present invention is implemented by a power supply voltage detecting apparatus for detecting a drop in the level of a power supply voltage below a specified level, the power supply voltage apparatus comprising: a voltage divider for dividing a power supply voltage by a specified ratio; a depletion MOS transistor having its source and gate connected to its base; an enhancement MOS transistor which is connected to the depletion MOS transistor, which has its source connected to its base, and which is fed the output of the voltage divider through its gate, a power supply voltage being applied across the depletion MOS transistor and the enhancement MOS transistor, and a signal present at a junction between the depletion MOS transistor and the enhancement MOS transistor being output as a detection signal.

Accordingly, the two MOS transistors are the only circuit elements employed in the power supply voltage detecting circuit, thus reducing variations in the operating voltage range, greatly improving the production yield of semiconductor circuits forming the detecting circuit, and greatly reducing production costs.

Other objects and further features of the present invention will become apparent from the following detailed description when read in conjunction with the accompanying drawings.

DESCRIPTION OF THE PREFERRED EMBODIMENTS

Figure 1:
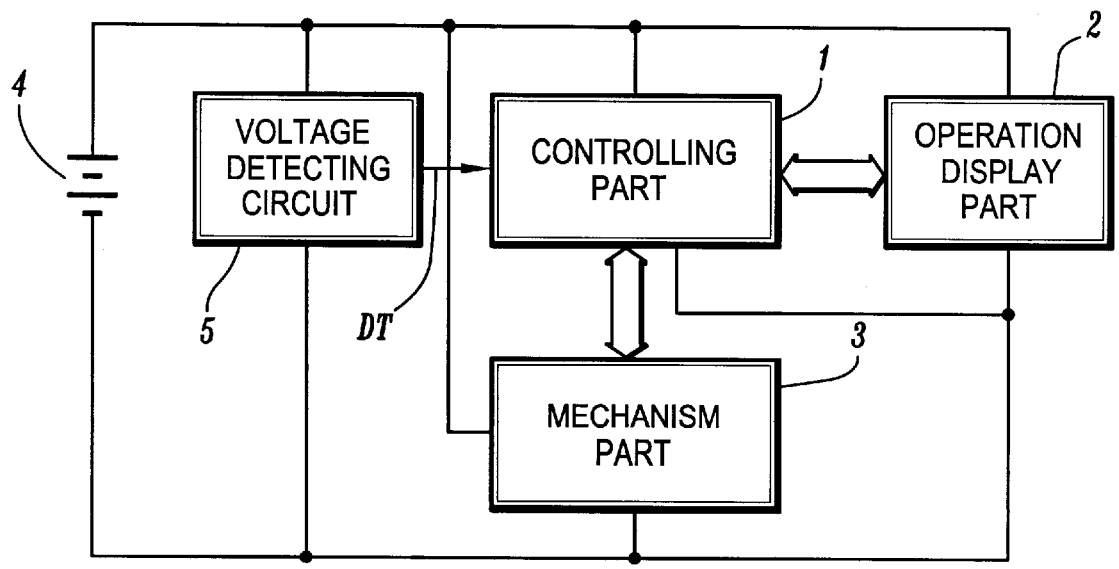
FIG. 1 is a block diagram showing a configuration of an electric equipment unit driven by dry batteries.
Figure 2:
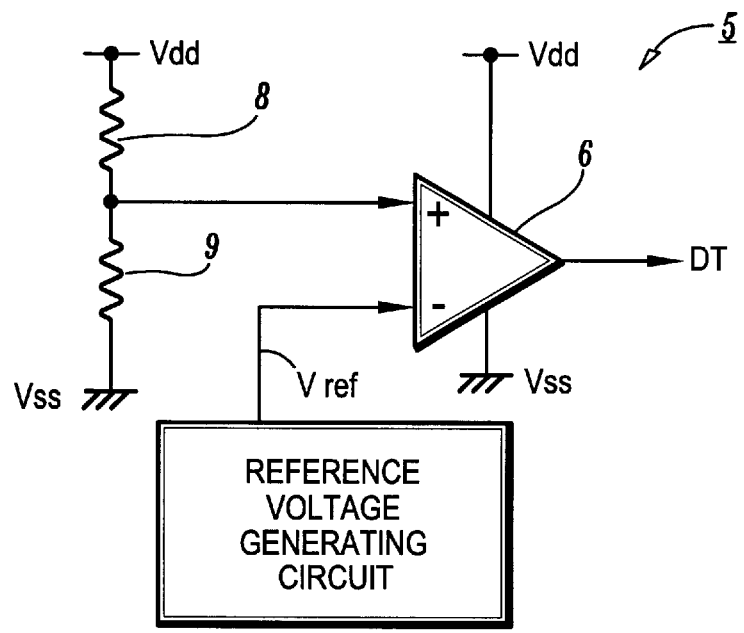
FIG. 2 is a block diagram showing a conventional voltage detecting circuit.
Figure 3:
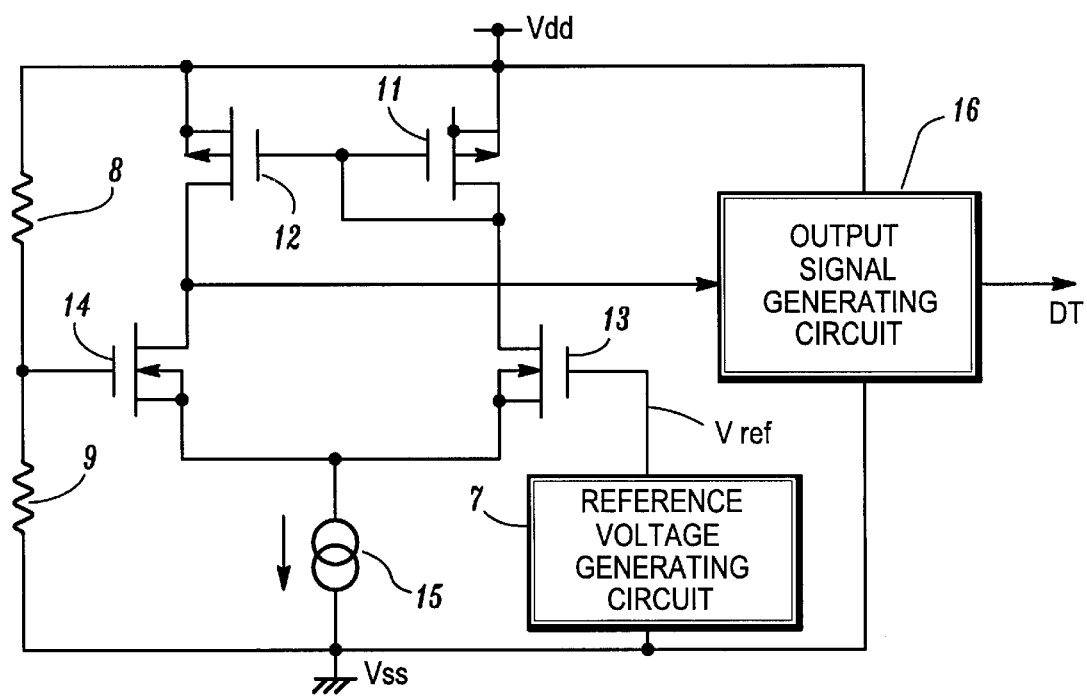
FIG. 3 is a circuit diagram showing an example of a difference amplifier in a voltage detecting circuit.
Figure 4:
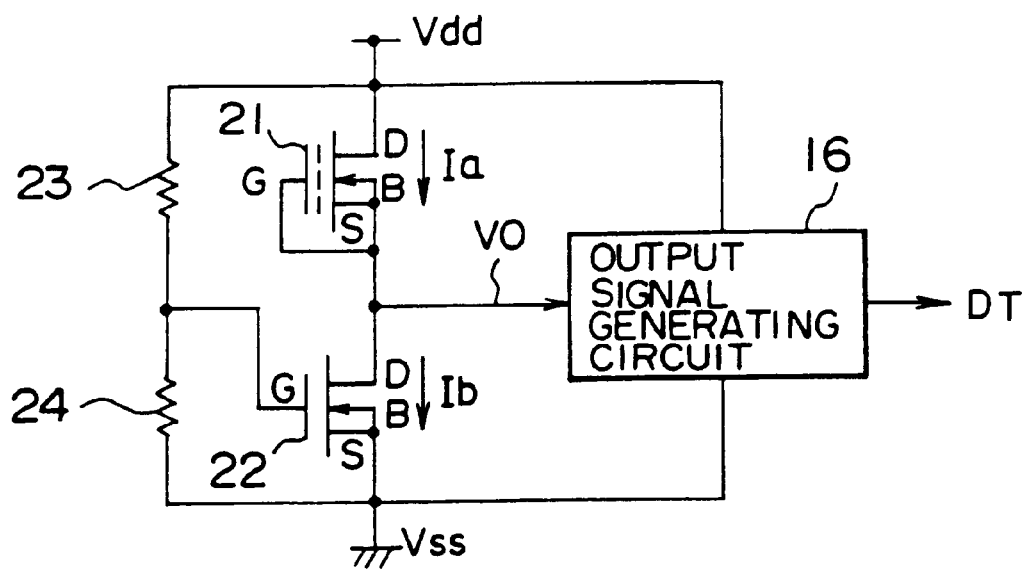
FIG. 4 is a circuit diagram showing a power supply voltage detecting circuit of an embodiment of the present invention.

FIG. 4 shows a power supply voltage detecting circuit of an embodiment of the present invention. In the figure, those parts that are identical to or correspond to parts of FIG. 3 are designated by the same reference numerals.

Referring to FIG. 4, a power supply voltage Vdd is applied to the drain (D) of a n-channel depletion MOS transistor (hereinafter, simply called a depletion MOS transistor) 21. The source (S) and the gate (G) of this depletion MOS transistor 21 are connected to the base (B) thereof. The source of the transistor 21 is also connected to the drain of an n-channel enhancement MOS transistor (hereinafter, simply called an enhancement MOS transistor) 22.

The source of the enhancement MOS transistor 22 and the base thereof are connected to each other. A fraction of the power supply voltage Vdd obtained by means of the resistances 23 and 24 forming a voltage divider is applied to the gate of the enhancement MOS transistor 22. A signal VO present at a junction between the depletion MOS transistor 21 and the enhancement MOS transistor 22 is applied to the output signal generating circuit 16. An output of this output signal generating circuit 16 is fed to a circuit (not shown in the figure) in the next stage, as a detection signal DT.

With the above arrangement, the depletion MOS transistor 21 operates in a saturation range because the gate and the source thereof are connected to each other. In order to allow the enhancement MOS transistor 22 to perform voltage detection, it is necessary to operate it in a saturation range.

In a case where a current flowing through the depletion MOS transistor 21 is Ia and a current flowing through the enhancement MOS transistor 22 is Ib, the following equations (2) and (3) (Serr's equation), which represent conditions to be fulfilled if the depletion MOS transistor 21 and the enhancement MOS transistor 22 are to operate in a saturation range, are obtained.

$$Ia=(K21)X(Vg21-Vth21)**2 \qquad (2)$$

$$Ib=(K22)X(Vg22-Vth22)**2 \qquad (3)$$

where K21 indicates a conductivity of the depletion MOS transistor 21; Vg21 indicates a voltage across the gate of the depletion MOS transistor 21 and the source thereof; Vth21 indicates a threshold voltage of the depletion MOS transistor 21; and (x) **2 indicates an operation where x is squared. K22 indicates a conductivity of the enhancement MOS transistor 22; Vg22 indicates a voltage across the gate of the enhancement MOS transistor 22 and the source thereof; and Vth22 indicates a threshold voltage of the enhancement MOS transistor 22.

When the power supply voltage Vdd reaches a specified level, for example 0.9 volts, and the signal VO is reversed, the current Ia and the current Ib becomes equal in value. Hence, the following equation (4) is obtained.

$$Ia = Ib \qquad (4)$$
$$\therefore (K21) \times (Vg21 - Vth21) **2$$
$$= (K22) \times (Vg22 - Vth22) **2$$

Adjusting the respective sizes of the depletion MOS transistor 21 and the enhancement MOS transistor 22 so that the conductivity K21 of the depletion MOS transistor 21 and the conductivity K22 of the enhancement MOS transistor 22 are equal, the following equation (5) is obtained from the equation (4).

$$Vg21-Vth21=Vg22-Vth22$$
$$\therefore Vg22=Vg21+Vth22-Vth21 \qquad (5)$$

Since the gate and the source of the depletion MOS transistor 21 are connected to each other, the voltage Vg21 across the gate and the source thereof is equal to 0 (that is, Vg21=0). Therefore, the following equation (6) is obtained from the equation (5).

$$Vg22=Vth22-Vth21 \qquad (6)$$

It is thus found that, when the power supply voltage Vdd is equal to a specified level to be detected. (hereinafter, referred to as the voltage detection level), the voltage Vg22 across the gate of the enhancement MOS transistor 22 and the source thereof, in other words the fraction voltage obtained by means of the resistances 23 and 24, is identical in value to the operational result obtained by subtracting the threshold voltage Vth21 of the depletion MOS transistor 21 from the threshold voltage Vth22 of the enhancement MOS transistor 22.

For example, when the threshold voltage Vth22 of the enhancement MOS transistor 22 is 0.3 volts and the threshold voltage Vth21 of the depletion MOS transistor 21 is −0.2 volts, the ratio of the resistances 23 and 24 should be 4:5 in order to detect a drop in the level of the power supply voltage Vdd to 0.9 volts.

Figure 5:
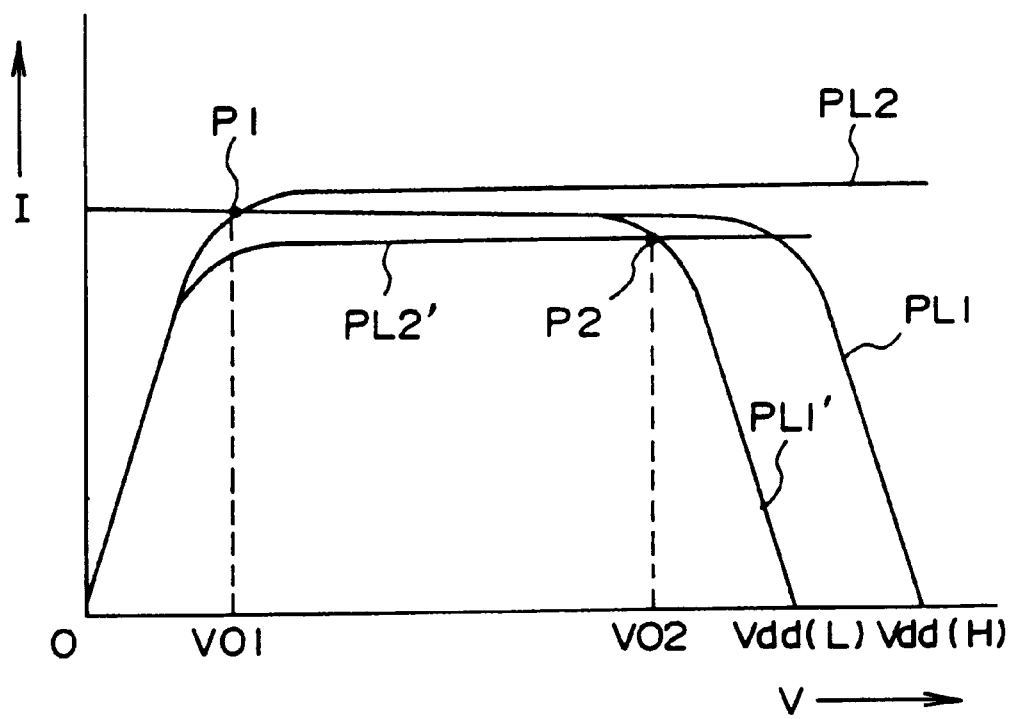
FIG. 5 is a graph explaining an operation of the circuit of FIG. 4.

The relationship between the power supply voltage Vdd and the current Ia of the depletion MOS transistor 21 is as shown by a curve PL1 of FIG. 5 when the power supply voltage Vdd is raised to a level Vdd (H) greater than the voltage detection level. The same relationship becomes as shown by a curve PL1' of FIG. 5 when the power supply voltage Vdd is lowered to a level Vdd (L) smaller than the voltage detection level.

The relationship between the power supply voltage Vdd and the current Ib of the enhancement MOS transistor 22 is as shown by a curve PL2 of FIG. 5 when the power supply voltage Vdd is raised to a level Vdd (H) while a voltage, which results from the power supply voltage Vdd being at the level Vdd (H), is being applied across the gate and the source of the enhancement MOS transistor 22. The same relationship will be as shown by a curve PL2' of FIG. 5, when the power supply voltage Vdd is lowered to a level Vdd (L) while a voltage, which results from the power supply voltage Vdd being at the level Vdd (L), is being applied across the gate and the source of the enhancement MOS transistor 22.

It is found from the above that the voltage value of the signal VO will be at a level VO1 (low voltage level) corresponding to a point P1 where the curve PL1 and the curve PL2 intersect, when the power supply voltage Vdd is at the level Vdd (H), and that the voltage value of the signal VO will be at a level VO2 (high voltage level) corresponding to a point P2 where the curve PL1' and the curve PL2' intersect, when the power supply voltage Vdd is at the level Vdd (L).

Accordingly, when the power supply voltage Vdd is at a voltage level greater than the voltage detection level, the level of the signal VO output to the output signal generating circuit 16 will be at the level VO1 (low voltage level). Conversely, when the power supply voltage Vdd is at a voltage level smaller than the voltage detection level, the level of the signal VO will be at the level VO2 (high voltage level). Hence, the output signal generating circuit 16 can properly generate the detection signal DT indicating the relationship between the power supply voltage Vdd and the voltage detection level.

A description will now be given of a temperature characteristic of the detected voltage in the power supply voltage detecting circuit of this embodiment.

The equation for the temperature characteristic of the detected voltage is expressed by obtaining a partial differential of both sides of the equation (6) with respect to temperature, the equation (7) below being the result thereof.

$$\delta Vg22/\delta T = \delta Vth22/\delta T - \delta Vth21/\delta T \qquad (7)$$

By ensuring that the temperature characteristics of the threshold voltages of the depletion MOS transistor 21 and the enhancement MOS transistor 22 are identical to each other, that is, taking into account the relationship $\delta Vth22/\delta T = \delta Vth21/\delta T$, the equation (7) is converted into the equation (8) below.

$$\delta Vg22/\delta T = 0 \qquad (8)$$

This means that the detected voltage does not vary with temperature, and that the temperature characteristic of the detected voltage of this power supply voltage detecting circuit is excellent.

A range of power supply voltage over which range this power supply voltage detecting circuit is operable is expressed by the inequality (9) below.

$$(Vdd-Vss) \geq Vth22 - 2 \times Vth21 \qquad (9)$$

As shown above, the voltage range over which this power supply voltage detecting circuit is operable is determined by two factors, i.e. the threshold voltage of the depletion MOS transistor 21 and the threshold voltage of the enhancement MOS transistor 22. This means that it is easy to produce a power supply voltage detecting circuit operable at a low voltage level. For example, it was determined through experiment performed by the present inventors that a power supply voltage detecting circuit operable at as low a voltage as 0.7 volts is achievable.

The variation in the characteristics of the circuits produced leads to the variation in the range of the power supply voltage, over which range the power supply voltage detecting circuit is operable. This variation in the voltage range is expressed by the equation (10) below.

$$\Delta(Vdd-Vss) \geq \Delta Vth22 - 2 \times \Delta Vth21 \qquad (10)$$

Since the depletion MOS transistor 21 and the enhancement MOS transistor 22 are both n-channel transistors, the variations in the threshold voltage in the circuits produced affect the depletion MOS transistor 21 and the enhancement MOS transistor 22 in the same way, which means that $\Delta Vth22$ and $\Delta Vth21$ are approximately equal to each other. Consequently, the equation (10) can be transformed into the equation (11) below.

$$\Delta(Vdd-Vss) \geq -\Delta Vth21 \qquad (11)$$

The variation in the range of the power supply voltage, over which range the power supply voltage detecting circuit produced is operable, substantially corresponds to the variation in the threshold voltage of the depletion MOS transistor 21. However, the production yield of the power supply voltage detecting circuits is greatly improved and the cost of producing the power supply voltage detecting circuit can be greatly reduced. For example, an experiment performed by the present inventors has shown that the production yield exceeds 98%.

While it is assumed in the above embodiment that the depletion MOS transistor and the enhancement MOS transistor constituting the power supply voltage detecting circuit are both n-channel transistors, p-channel transistors may also be used as the depletion MOS transistor and the enhancement MOS transistor, respectively.

As has been described above, the MOS transistors are the only circuit elements employed in the present invention, thus reducing variations in the operating voltage range, greatly improving the production yield of integrated circuits constituting the circuit, and greatly reducing production costs.

The present invention is not limited to the above described embodiment, and variations and modifications may be made without departing from the scope of the present invention.

What is claimed is:

1. A power supply voltage detecting apparatus for detecting a drop in the level of a power supply voltage below a specified level, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor having its source and gate connected to its base and operating in saturation as a constant current source providing a constant current to said enhancement MOS transistor, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect small variations in the power supply voltage and to provide an output detection signal at a junction between said depletion MOS transistor and said enhancement MOS transistor, wherein the voltage divider comprises a pair of resistors and has no substantial temperature dependence, and the temperature dependence of threshold voltages of said enhancement MOS transistor and depletion MOS transistor are substantially the same and cancel each other, so that a detected voltage does not vary with temperature and wherein the specified ratio is selected so that an output of the voltage divider operates both the depletion MOS transistor and the enhancement MOS transistor in saturation.

2. The power supply voltage detecting apparatus as claimed in claim 1, wherein said depletion MOS transistor and said enhancement MOS transistor are both n-channel transistors.

3. The power supply voltage detecting apparatus as claimed in claim 1, wherein said depletion MOS transistor and said enhancement MOS transistor are both p-channel transistors.

4. The power supply voltage detecting apparatus as claimed in claim 2, wherein said depletion MOS transistor and said enhancement MOS transistor are so sized that their conductivity are identical.

5. The power supply voltage detecting apparatus as claimed in claim 4, wherein said depletion MOS transistor and said enhancement MOS transistor have the identical temperature characteristic with respect to the threshold voltage.

6. The power supply voltage detecting apparatus as claimed in claim 3, wherein said depletion MOS transistor and said enhancement MOS transistor are so sized that their conductivity are identical.

7. The power supply voltage detecting apparatus as claimed in claim 5, wherein the identical temperature characteristic of said depletion MOS transistor and said enhancement MOS transistor are represented by $$\delta V_{th}22/\delta T = \delta V_{th}21/\delta T$$

where $\delta V_{th}21$ is a variation in a threshold voltage of said depletion MOS transistor, $\delta V_{th}22$ is a variation in a threshold voltage of said enhanced MOS transistor, and $\delta T$ is a variation in temperature.

8. A power supply voltage detecting apparatus for detecting a drop in the level of a power supply voltage, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor connected to said enhancement MOS transistor and operating in saturation as a constant current source, said depletion MOS transistor having its source and gate connected to its base, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect a drop in the level of the power supply voltage and to provide an output detection signal at a junction between said depletion MOS transistor and said enhancement MOS transistor, wherein the voltage divider comprises a pair of resistors and has no substantial temperature dependence, and the temperature dependence of threshold voltages of said enhancement MOS transistor and depletion MOS transistor are substantially the same and cancel each other, so that a detected voltage does not vary with temperature and wherein the specified ratio is selected so that an output of the voltage divider operates both the depletion MOS transistor and the enhancement MOS transistor in saturation.

9. A power supply voltage detecting apparatus for detecting a drop in the level of a power supply voltage below a specified level, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor having its source and gate connected to its base to provide a constant current to said enhancement MOS transistor, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect small variations in the power supply voltage and to provide an output detection signal at a junction between said depletion MOS transistor and said enhancement MOS transistor, wherein the voltage divider comprises a pair of resistors and has no substantial temperature dependence, and the temperature dependence of threshold voltages of said enhancement MOS transistor and depletion MOS transistor are substantially the same and cancel each other, so that a detected voltage does not vary with temperature and wherein the specified ratio is selected so that an output of the voltage divider operates both the depletion MOS transistor and the enhancement MOS transistor in saturation.

10. A power supply voltage detecting apparatus for detecting a drop in the level of a power supply voltage, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor connected to said enhancement MOS transistor and having its source and gate connected to its base, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect a drop in the level of the power supply voltage and to provide an output detection signal at a junction between said depletion MOS transistor and said enhancement MOS transistor, wherein the voltage divider comprises a pair of resistors and has no substantial temperature dependence, and the temperature dependence of threshold voltages of said enhancement MOS transistor and depletion MOS transistor are substantially the same and cancel each other, so that a detected voltage does not vary with temperature and wherein the specified ratio is selected so that an output of the voltage divider operates both the depletion MOS transistor and the enhancement MOS transistor in saturation.

11. A power supply voltage detecting apparatus for detecting a drop in the level of a power supply voltage below a specified level, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor having its source and gate connected to its base to provide a constant current to said enhancement MOS transistor, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect small variations in the power supply voltage and to provide an output detection signal at a junction between said depletion MOS transistor and said enhancement MOS transistor, wherein the voltage divider comprises a pair of resistors and has no substantial temperature dependence, and control of temperature dependent variation in the level of the power supply voltage detected depends on the temperature dependence of threshold voltages of said enhancement MOS transistor and depletion MOS transistor, and wherein the temperature dependencies cancel each other so that a detected voltage does not vary with temperature and wherein the specified ratio is selected so that an output of the voltage divider operates both the depletion MOS transistor and the enhancement MOS transistor in saturation.

12. A power supply voltage detecting apparatus for detecting a drop in the level of a power supply voltage, said power supply voltage detecting apparatus comprising:

a voltage divider for dividing said power supply voltage by a specified ratio;

an enhancement MOS transistor which has its source connected to its base, and which is fed an output of said voltage divider through its gate; and a depletion MOS transistor connected to said enhancement MOS transistor and having its source and gate connected to its base, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect a drop in the level of the power supply voltage and to provide an output detection signal at a junction between said depletion MOS transistor and said enhancement MOS transistor, wherein the voltage divider comprises a pair of resistors and has no substantial temperature dependence, and control of temperature dependent variation in the level of the power supply voltage detected depends on the temperature dependence of threshold voltages of said enhancement MOS transistor and depletion MOS transistor, and wherein the temperature dependencies cancel each other so that a detected voltage does not vary with temperature and wherein the specified ratio is selected so that an output of the voltage divider operates both the depletion MOS transistor and the enhancement MOS transistor in saturation.

13. An electronic device which uses at least one of a dry battery and a chargeable battery for supplying a power supply voltage, said electronic device comprising:

a voltage divider for dividing said power supply voltage by a specified ratio;

an enhancement MOS transistor which has its source connected to its base, and which is fed an output of said voltage divider through its gate; and a depletion MOS transistor having its source and gate connected to its base and operating in saturation as a constant current source providing a constant current to said enhancement MOS transistor, the depletion MOS transistor and the enhancement MOS transistor having same conduction type, conductivity and temperature dependence of threshold voltage;

wherein a current flowing through said enhancement MOS transistor is compared to a current flowing through said depletion MOS transistor to detect small variations in the power supply voltage and to provide an output detection signal at a junction between said depletion MOS transistor and said enhancement MOS transistor, wherein the voltage divider comprises a pair of resistors and has no substantial temperature dependence, and the temperature dependence of threshold voltages of said enhancement MOS transistor and depletion MOS transistor are substantially the same and cancel each other, so that a detected voltage does not vary with temperature, wherein the specified ratio is selected so that an output of the voltage divider operates both the depletion MOS transistor and the enhancement MOS transistor in saturation and wherein the output detection signal is used for power on and power off control.

* * * * *